United States Patent
Rao et al.

(10) Patent No.: US 9,201,308 B2
(45) Date of Patent: Dec. 1, 2015

(54) WATER-RICH STRIPPING AND CLEANING FORMULATION AND METHOD FOR USING SAME

(71) Applicant: AIR PRODUCTS AND CHEMICALS, INC., Allentown, PA (US)

(72) Inventors: Madhukar Bhaskara Rao, Fogelsville, PA (US); Gautam Banerjee, Latham, NY (US); Thomas Michael Wieder, Emmaus, PA (US); Yi-Chia Lee, Danshuei Jen Taipei (TW); Wen Dar Liu, Chupei (TW); Aiping Wu, Macungie, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 226 days.

(21) Appl. No.: 13/936,656

(22) Filed: Jul. 8, 2013

(65) Prior Publication Data
US 2013/0296215 A1  Nov. 7, 2013

Related U.S. Application Data

(62) Division of application No. 12/859,624, filed on Aug. 19, 2010, now Pat. No. 8,518,865.

(60) Provisional application No. 61/238,268, filed on Aug. 31, 2009.

(51) Int. Cl.
*G03F 7/42* (2006.01)
*C11D 3/00* (2006.01)
*C11D 7/06* (2006.01)
*C11D 7/26* (2006.01)
*C11D 7/32* (2006.01)
*C11D 7/50* (2006.01)
*C11D 11/00* (2006.01)

(52) U.S. Cl.
CPC .............. *G03F 7/426* (2013.01); *C11D 3/0073* (2013.01); *C11D 7/06* (2013.01); *C11D 7/261* (2013.01); *C11D 7/3218* (2013.01); *C11D 7/3281* (2013.01); *C11D 7/5004* (2013.01); *C11D 11/0047* (2013.01); *G03F 7/425* (2013.01)

(58) Field of Classification Search
CPC .................................................. C11D 11/0047
See application file for complete search history.

(56) References Cited

U.S. PATENT DOCUMENTS

| | | | |
|---|---|---|---|
| 4,395,479 A | 7/1983 | Ward et al. | |
| 4,401,748 A | 8/1983 | Ward, Jr. et al. | |
| 4,428,871 A | 1/1984 | Ward et al. | |
| 5,308,745 A | 5/1994 | Schwartzkopf | |

(Continued)

FOREIGN PATENT DOCUMENTS

| | | |
|---|---|---|
| CN | 1875325 A | 12/2006 |
| EP | 0578507 A2 | 1/1994 |

(Continued)

*Primary Examiner* — Gregory Webb
(74) *Attorney, Agent, or Firm* — Lina Yang

(57) ABSTRACT

The present invention relates to water-rich formulations and the method using same, to remove bulk photoresists, post-etched and post-ashed residues, residues from Al back-end-of-the-line interconnect structures, as well as contaminations. The formulation comprises: hydroxylamine; corrosion inhibitor containing a mixture of alkyl dihydroxybenzene and hydroxyquinoline; an alkanolamine, a water-soluble solvent or the combination of the two; and at least 50% by weight of water.

20 Claims, 7 Drawing Sheets

(56) References Cited

U.S. PATENT DOCUMENTS

| | | |
|---|---|---|
| 5,334,332 A | 8/1994 | Lee |
| 5,496,491 A | 3/1996 | Ward et al. |
| 5,556,482 A * | 9/1996 | Ward et al. .................. 134/38 |
| 5,798,323 A | 8/1998 | Honda et al. |
| 5,911,835 A | 6/1999 | Lee et al. |
| 6,110,881 A | 8/2000 | Lee et al. |
| 6,156,661 A | 12/2000 | Small |
| 6,225,034 B1 | 5/2001 | Tanabe et al. |
| 6,319,885 B1 | 11/2001 | Lee et al. |
| 6,328,943 B1 | 12/2001 | Roling et al. |
| 6,465,403 B1 * | 10/2002 | Skee .................. 510/175 |
| 6,475,966 B1 | 11/2002 | Sahbari |
| 7,051,742 B2 | 5/2006 | Lee et al. |
| 7,144,849 B2 | 12/2006 | Lee et al. |
| 7,671,001 B2 | 3/2010 | Skee |
| 7,727,420 B2 | 6/2010 | Ward |
| 2002/0077259 A1 | 6/2002 | Skee |
| 2004/0067860 A1 | 4/2004 | Lee |
| 2004/0152608 A1* | 8/2004 | Hsu .................. 510/175 |
| 2004/0198621 A1 | 10/2004 | Lee et al. |
| 2004/0220065 A1 | 11/2004 | Hsu |
| 2007/0060490 A1 | 3/2007 | Skee |
| 2007/0179072 A1* | 8/2007 | Rao et al. .................. 510/175 |
| 2007/0232513 A1 | 10/2007 | Hsu |
| 2008/0169004 A1* | 7/2008 | Wu .................. 134/2 |
| 2009/0112024 A1 | 4/2009 | Lee |
| 2009/0120458 A1* | 5/2009 | Hao .................. 134/2 |
| 2009/0176685 A1 | 7/2009 | Ward |

FOREIGN PATENT DOCUMENTS

| | | |
|---|---|---|
| JP | 11-119444 | 4/1999 |
| JP | 11-194505 | 7/1999 |
| JP | 2000056480 | 2/2000 |
| JP | 2000-199971 | 7/2000 |
| JP | 2001500922 A | 1/2001 |
| JP | 2007526523 A | 9/2007 |
| JP | 2008537182 A | 9/2008 |
| WO | 9836045 A1 | 8/1998 |
| WO | 9960083 A1 | 11/1999 |
| WO | 2005085957 A1 | 9/2005 |
| WO | 2006112994 A1 | 10/2006 |

* cited by examiner

WATER-RICH STRIPPING AND CLEANING FORMULATION AND METHOD FOR USING SAME

BACKGROUND OF THE INVENTION

Conventional stripping and cleaning formulations for Al back-end-of the-line (Al BEOL) cleaning of ashed and unashed substrates typically contain a hydroxlyamine, a solvent (optional), an alkanolamine (optional), water and a corrosion inhibitor or chelating agent. Conventional chemistries typically contain a majority of organic components and amines and a minority of water. Typical examples of such chemistries are seen in U.S. Pat. No. 5,911,835, U.S. Pat. No. 6,110,881, U.S. Pat. No. 6,319,885, U.S. Pat. No. 7,051,742, and U.S. Pat. No. 7,144,849. In the above listed patents, dihydroxy-aromatic corrosion inhibitors, of which catechol (dihydroxybenzene) is commonly used. Catechol has been used as a corrosion inhibitor for aluminum. In addition, catechol has been used as a chelating agent to extend the stability of hydroxylamine-containing formulation.

It is well known to those in the art that a key property of an effective cleaner is its ability to attack and/or dissolve post-etch and/or post-ash residues without substantially attacking the underlying interconnect dielectric or metals, that is, the selection of corrosion inhibitor is the key to controlling the metal etch rate.

In BEOL applications for Al interconnect structures, the corrosion inhibitor must be able to inhibit etching of aluminum and other interconnect metals/film, however since aluminum is electrochemically very active, it is most susceptible to corrosion and/or etching.

It would therefore be desirable to provide a cleaning formulation and process capable of removing those unwanted residues without corroding, dissolving or dulling the exposed surfaces of the interconnect structures. Hydroxylamine is very effective at removing residues and unashed photoresist from semiconductor substrates, but is susceptible to decomposition, even at room temperature. It is critical to find components for the cleaning formulation containing hydroxylamine that can stabilize hydroxylamine or do not accelerate hydroxylamine decomposition. Therefore, it would be desirable to control aluminum etch rate and to stabilize hydroxylamine for the cleaning formulation containing hydroxylamine.

BRIEF SUMMARY OF THE INVENTION

Accordingly, one aspect of the present invention is water-rich formulations for removing the photoresist, post-etched and post-ashed residues, residues from Al back-end-of-the-line interconnect structures, as well as contaminants.

In one embodiment, the invention provides a water-rich formulation comprising: hydroxylamine, hydroxylamine salt compound, and mixtures thereof; alkyl-dihydroxybenzene; hydroxyquinoline; an alkanolamine which is miscible with said hydroxylamine; and water; wherein the water-rich formulation having at least 50% by weight of water.

In another embodiment, the invention provides a water-rich formulation comprising: hydroxylamine, hydroxylamine salt compound, and mixtures thereof; alkyl-dihydroxybenzene; hydroxyquinoline; a water-soluble solvent; and water; wherein the water-rich formulation having at least 50% by weight of water.

Yet, in another embodiment, the invention provides a water-rich formulation comprising: hydroxylamine, hydroxylamine salt compound, and mixtures thereof; alkyl-dihydroxybenzene; hydroxyquinoline; an alkanolamine which is miscible with said hydroxylamine a water-soluble solvent; and water; wherein the water-rich formulation having at least 50% by weight of water.

According to another aspect of the present invention, provided are methods of removing post-etched and post-ashed residues from a substrate comprising: applying a formulation as recited above to a substrate to remove the photoresist, post-etched and post-ashed residues, as well as contaminants from the substrate.

DETAILED DESCRIPTION OF THE INVENTION

Figure 1:
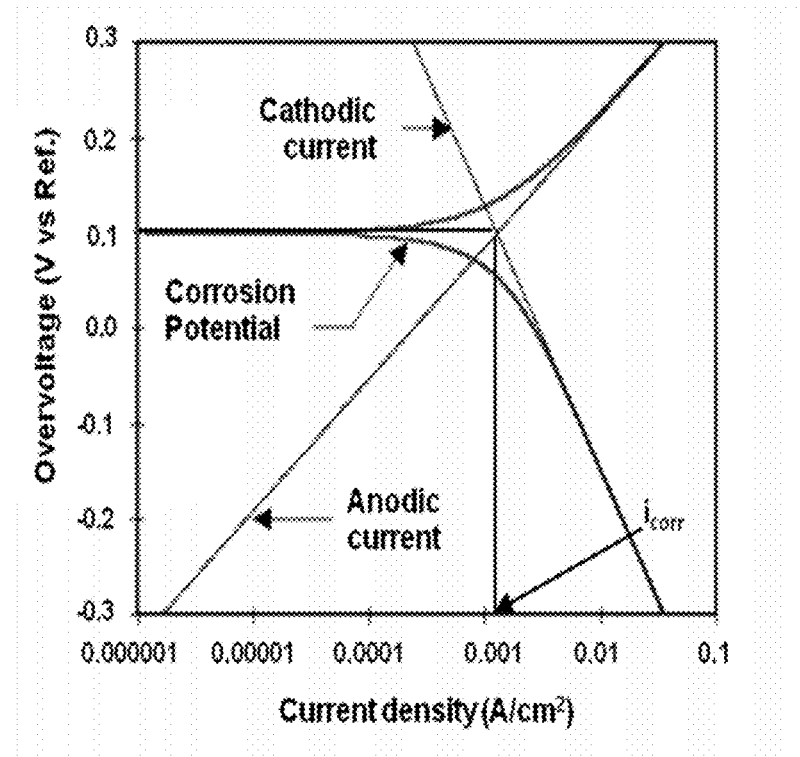
FIG. 1. Tafel analysis shows the plotted corrosion potential of an electrode relative to a reference against the logarithm of the corrosion current density.

Cleaning formulations are needed for Al BEOL (back-end-of the-line) cleaning of ashed and unashed substrates. It is well known to those in the art that a key property of an effective cleaner is its ability to attack and dissolve post-etch and post-ash residues without substantially attacking the underlying interconnect dielectric or metals; the selection of corrosion inhibitor is the key to controlling the metal etch rate.

Aluminum is electrochemically very active, it is most susceptible to corrosion and/or etching. For Al interconnect structures, the corrosion inhibitor must be able to inhibit etching of aluminum and other interconnect metals and/or films.

Conventional cleaning formulations typically contain a hydroxlyamine, a solvent (optional), an alkanolamine (optional), water and a corrosion inhibitor or chelating agent. One way of modulating the corrosive effect of hydroxylamines (and amines) in cleaning formulations is by keeping the water level low and using a high concentration of solvent, thus solvent-rich formulations. In many of the above listed patents, catechol has been used as a corrosion inhibitor for aluminum and/or chelating agent to extend the stability of hydroxylamine-containing solvent-rich formulation.

Water-rich formulations containing hydroxylamine for Al BEOL cleaning have been developed in the present invention. Here, "water-rich" refers to the formulation having at least 50% by weight of water.

The water-rich formulations typically comprise from 1 to 30% by weight of at least one selected from a hydroxylamine, a hydroxylamine salt compound, and mixtures thereof; from 0.1 to 5% by weight of a corrosion inhibitor; one component selected from the group consisting of from 5% to 45% by weight of a water-soluble solvent, from 5% to 45% by weight of an alkanolamine which is miscible with said hydroxylamine, and the combination of the two.

The water-soluble solvent includes but not limited to ethylene glycol, propylene glycol, benzyl alcohol, dimethyl sulfoxide, dimethylurea, glycerol, dipropylene glycol monomethyl ether, n-methyl pyrrolidone, tetrahydrofurfural alcohol, tetramethoxyethane, and mixtures thereof.

The alkanolamine which is miscible with said hydroxylamine includes but not limited to monoethanolamine, aminoethoxyethanol, aminopropylmorpholine, monoethanolamine, N-methyl ethanolamine, N-ethyl ethanolamine, N,N-dimethylethanolamine, N,N-diethyl ethanolamine, N-methyl diethanolamine, N-ethyl diethanolamine, diethanolamine, triethanol amine, tertiarybutyldiethanol amine, isopropanolamine, 2-amino-1-propanol, 3-amino-1-propanol, 2-amino-1-butanol, isobutanolamine, 2-amino-2-ethoxypropanol, 2-amino-2-ethoxyethanol, and mixtures thereof.

Different corrosion inhibitors have been used for water-rich formulations in the present invention. In addition of catechol, a combination of organic compounds, specifically, alkyl dihydroxybenzenes and hydroquinolines has been tested. Alkyl dihydroxybenzenes include but not limited to those having linear or branched alkyl group contains 2-6 carbon atoms, such as, tertiary butyl catechol. Hydroquinolines include but not limited to 2-hydroxyquinoline, 4-hydroxyquinoline, 6-hydroxyquinoline and 8-hydroxyquinoline.

In the following working examples, catechol has been tested in Examples 1 to 3, and a combination of tertiary butyl catechol and 8-hydroxyquinoline has been tested in Examples 4 to 5.

EXAMPLES

The following examples are provided for the purpose of further illustrating the present invention but are by no means intended to limit the same.

Example 1

Catechol as Corrosion Inhibitor/Chelating Agent

Three formulations with differing levels of water, solvent, and hydroxylamine have been tested in this example. Catechol was used as the corrosion inhibitor. Catechol was selected for the experiments since it is a well-know corrosion inhibitor in the field and was a common component in the patents listed above.

Table 1 listed the aluminum etch rate of three formulations.

TABLE 1

Aluminum etch rate for hydroxylamine formulations with catechol as the corrosion inhibitor

|  | Formulation A | Formulation B | 18647-76I |
|---|---|---|---|
| Monoethanol amine | 59.20 | 65.00 | 20.00 |
| hydroxylamine | 18.05 | 10 | 7.5 |
| Catechol | 4.70 | 5.00 | 5.00 |
| Water | 18.05 | 20 | 67.5 |
| Al etch rate (ER), Å/min | 1 | 1 | 7 |
| Temperature ° C. of ER, | 55 | 45 | 45 |

Formulations A and B in Table 1 were lower in water (<20%), but higher in monoethanol amine solvent (>50%). Thus, formulations A and B were solvent-rich formulations. On the contrary, formulation 18647-761 contained higher level (>50%) water and lower level of monoethanol amine solvent (20% or less). Therefore, formulation 18647-761 was a water-rich formulation.

As shown in Table 1, formulations A and B had lower aluminum etch rates when catechol used as a corrosion inhibitor. Formulation 18647-761 had higher aluminum etch rates (seven times higher than formulations A and B) when catechol was used as a corrosion inhibitor. Clearly, the effectiveness of catechol as a corrosion inhibitor was favored when the water level was low (~20% or less). As the water level increased the aluminum etch rate has increased substantially.

Example 2

Electrochemical Characterization of Corrosion Rate Using Catechol

The characterization of corrosion rate was done by using Tafel analysis method well known in electrochemistry. FIG. 1 showed a typical plotted potential of an electrode relative to a reference against the logarithm of the corrosion current density.

The electrochemical potential versus current density for Al/0.5 wt % Cu samples was measured in a series of water-rich, hydroxylamine cleaning formulations to characterize the corrosion inhibition of a variety of inhibitors.

Figure 2:
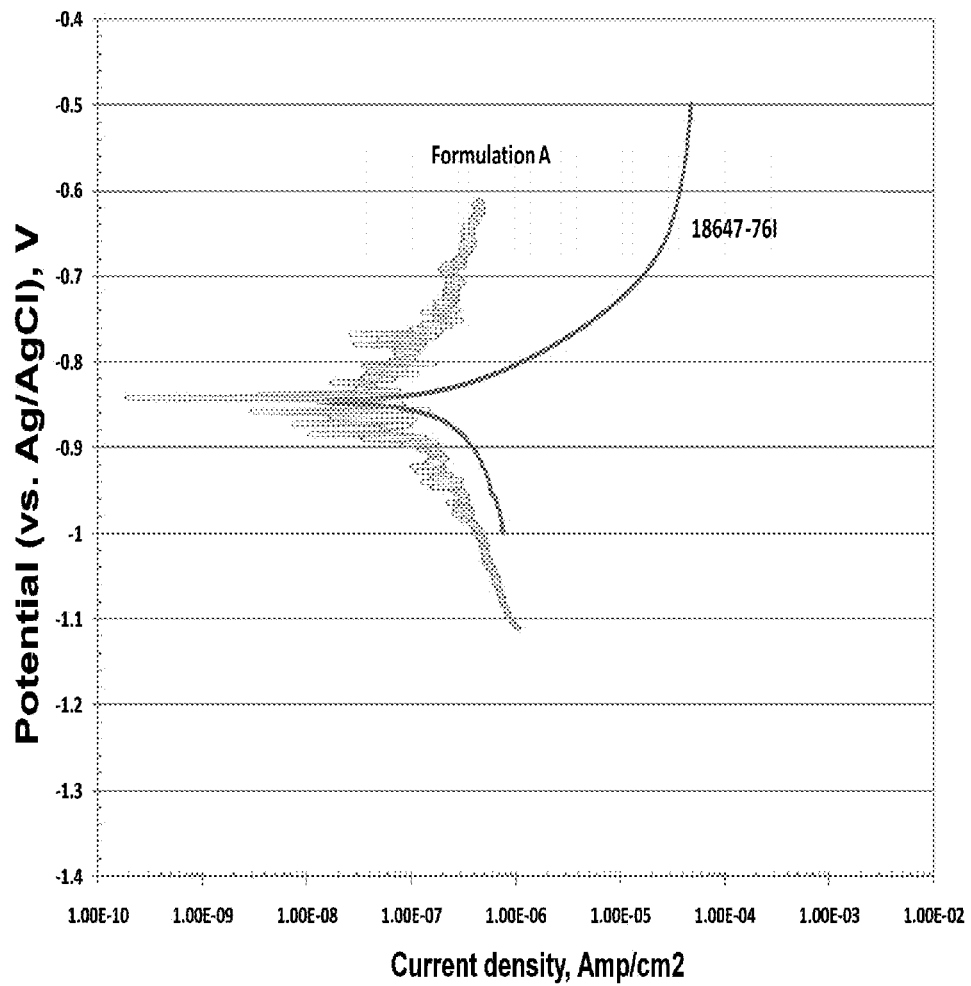
FIG. 2. Tafel analysis of a water-rich and a solvent-rich formulations both having catechol as the corrosion inhibitor.

Tafel plots of formulations using catechol as the corrosion inhibitor were shown in FIG. 2. Both formulation A (a solvent-rich formulation) and formulation 18647-76I (a water-rich formulation) were shown in FIG. 2 for comparison.

Formulation A had a lower corrosion current than formulation 18647-76I, indicating catechol as the corrosion inhibitor functioned better in formulation A. Again, catechol was shown to be a poor corrosion inhibitor in water-rich systems. This was consistent with the higher Al etch rate data shown in Table 1.

Example 3

Hydroxylamine Stability in Water-Rich Formulations Using Catechol

Catechol and other dihydroxybenzenes have been used as chelating agents in several US patents specifically to control the stability of the cleaning formulation (see U.S. Pat. No. 5,911,835, U.S. Pat. No. 6,110,881, U.S. Pat. No. 6,319,885, U.S. Pat. No. 7,051,742, and U.S. Pat. No. 7,144,849). The primary role of the chelator is to stabilize the hydroxylamine in solution and prevent its degradation.

Figure 3:
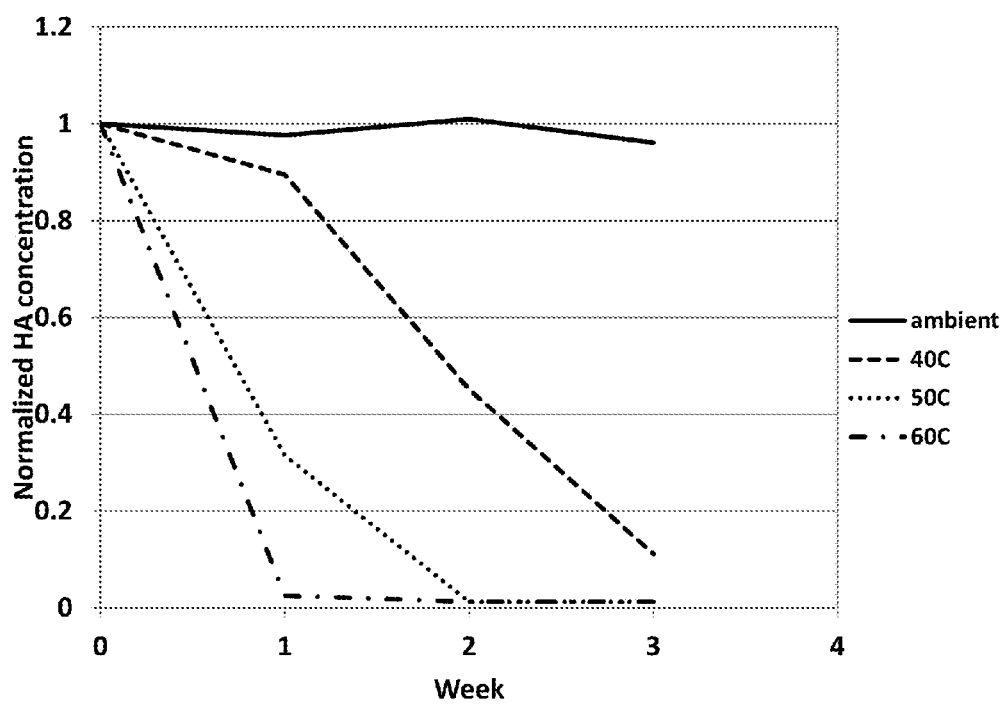
FIG. 3. Stability of hydroxylamine as a function of temperature in water-rich formulation having catechol as the corrosion inhibitor.

The measurements of hydroxylamine stability (or the decomposition of hydroxylamine) in water-rich formulation 18647-76I having catechol as chelating agent were carried out. More specifically, the normalize hydroxylamine concentration in solution in formulation 18647-76I as a function of time was measured for sample at room temperature, 40° C., 50° C., and 60° C. The results were shown in FIG. 3.

The results indicated that the amount of hydroxylamine remaining in solution decreased dramatically as the sample temperature was increased. In fact when the formulation was held at 60° C., 97% of the hydroxylamine was lost in one week.

Formulation 18647-78E, which contained the same level of monoethanol amine and hydroxylamine as 18647-76I, but contained no catechol, was tested under the same conditions. More specifically, formulation 18647-78E, contained 20 wt % monoethanol amine, 7.5 wt % hydroxylamine and 72.5 wt % of water.

Figure 4:
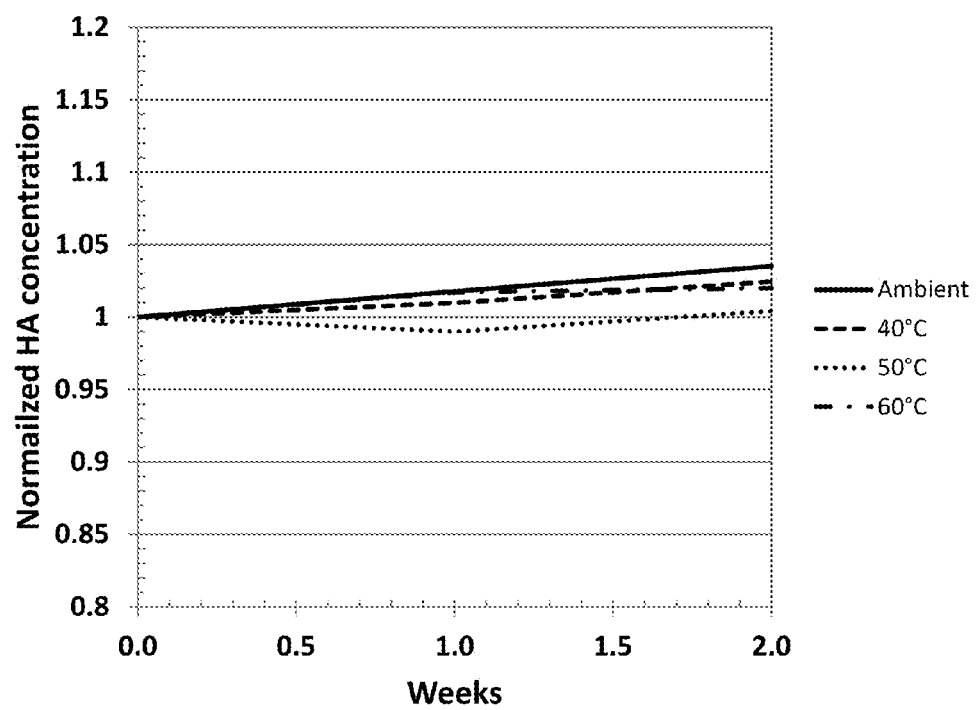
FIG. 4. Stability of hydroxylamine as a function of temperature in water-rich formulation not having catechol as the corrosion inhibitor.

The results were shown in FIG. 4. FIG. 4 indicated no degradation of hydroxylamine in formulation 18647-78E, even for samples maintained at elevated temperature. The water-rich formulations were more stable without the "stabilizer": catechol. Based on these data, it would be reasonable to conclude that catechol is a catalyst to hydroxylamine decomposition in water-rich formulations rather than a stabilizer.

Note, the results were in direct contrast to the disclosures in the prior art. Our results indicated that the use of catechol in water-rich formulations was not effective at stabilizing the hydroxylamine and, in fact, the use of catechol was effective catalyzing the decomposition or degradation of hydroxylamine.

Example 4

Effective Corrosion Inhibitors for Al Etching that do not Catalyze Hydroxylamine Decomposition Water-rich formulations 18647-76K, 18647-79A and 18647-78F were tested in this example. The alkanol amine and hydroxylamine concentrations in the formulations were held in similar levels (see Table 2). As for the corrosion inhibitor, formulation 18647-76K contained 1 wt % of tertiary butyl catechol (tBC) and 1 wt % of 8 hydroxyquinoline (8HQ), 18647-79A contained 1 wt % of 8 hydroxyquinoline (8HQ), and formulation 18647-78F contained 1 wt % of tertiary butyl catechol (tBC).

TABLE 2

Al/0.5 Cu corrosion current for water-rich hydroxylamine formulations from Tafel plots

|  | 18647-76K | 18647-79A | 18647-78F | 18647-76I |
|---|---|---|---|---|
| Monoethanol amine | 20 | 20 | 20 | 20 |
| hydroxylamine | 7.5 | 7.5 | 7.5 | 7.5 |
| Water | 70.5 | 71.5 | 71.5 | 67.5 |
| 8-hydroxyquinoline | 1 | 1 | 0 | 0 |
| t-butyl catechol | 1 | 0 | 1 | 0 |
| catechol |  |  |  | 5.0 |
| Corrosion current density $i_{corr}$, A/cm$^2$ | $8 \times 10^{-8}$ | $3 \times 10^{-5}$ | $2 \times 10^{-7}$ | $1 \times 10^{-6}$ |

Figure 5:
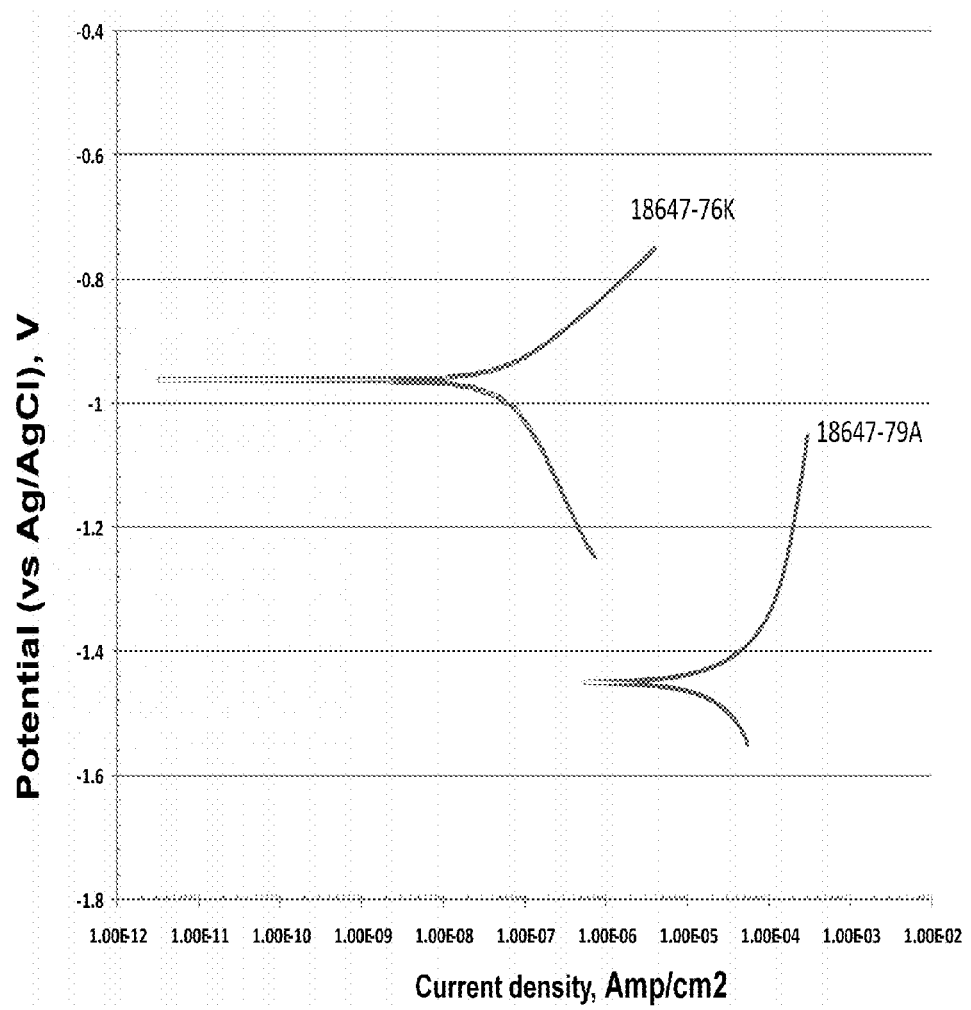
FIG. 5. Tafel analysis of water-rich formulations having (a) tertiary butyl catechol (tBC) and 8 hydroxyquinoline (8HQ); and (b) 8 hydroxyquinoline (8HQ).

Tafel results on two formulations 18647-76K, 18647-79A were shown in FIG. 5. Anodic polarization curve for 18647-79A showed strong indication for passivity, trying to achieve limiting current, while for 18647-76K, anodic polarization curve indicated perfect active polarization. This indicated that a passive film would likely form on Al surface for 18647-79A, while the possibility would be absent for 18647-76K. In terms of cleaning, this implied that there would not be an extra effort required to remove a passive film formed on Al by formulation 18647-76K, whereas for 18647-79A a passive film would likely be formed which would require further effort to remove. It is important not to leave a passiviating film on the metal film because such films can affect the electrical performance of the semiconductor device.

Figure 6:
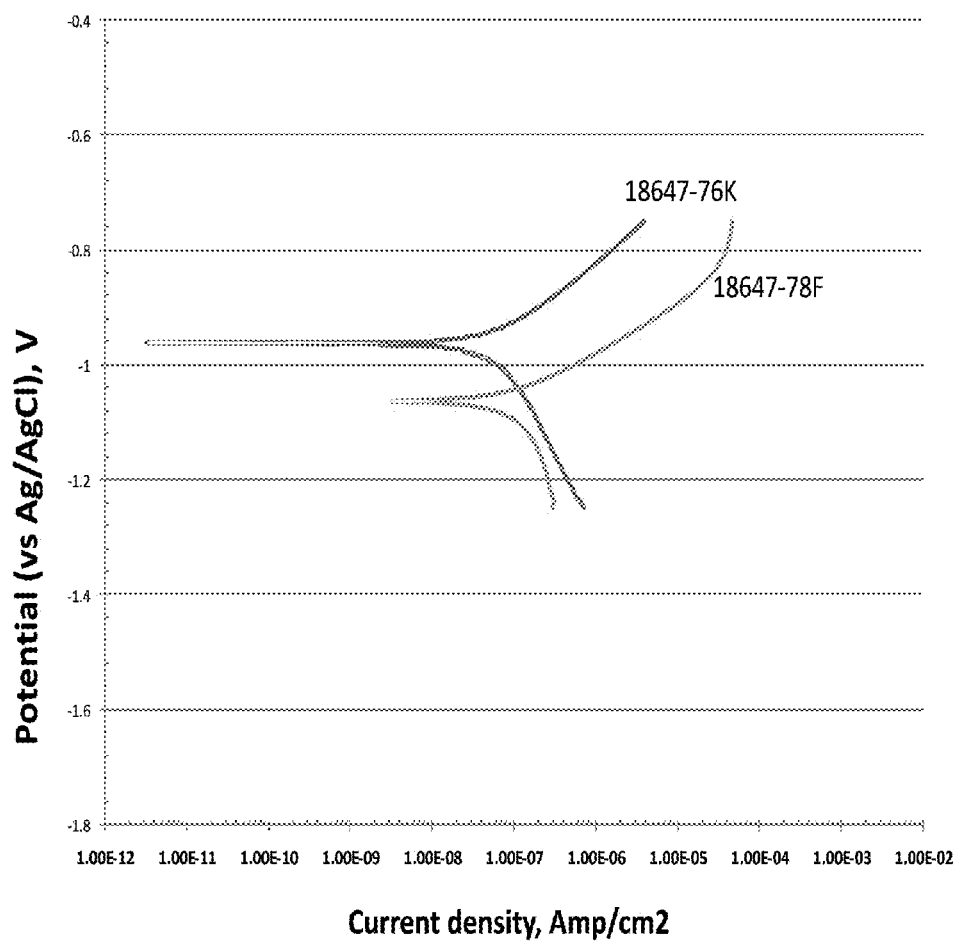
FIG. 6. Tafel analysis of water-rich formulations having (a) tertiary butyl catechol (tBC) and 8 hydroxyquinoline (8HQ); and (b) tertiary butyl catechol (tBC).

Tafel results on two formulations 18647-76K and 18647-78F were shown in FIG. 6. Anodic polarization curve for 18647-78F showed strong indication for passivity, trying to achieve limiting current at a higher potential. Again, indicated that a passivating film could be forming on the Al surface for 18647-78F, and which would be difficult to remove.

As shown in Table 2, the corrosion currents of formulation 18647-79A 18647-78F were both higher than formulation 18647-76K, with formulation 18647-79A approximately 2.5 orders of magnitude higher. The corrosion current of formulation 18647-76I from FIG. 2 in Example 2 was also listed in Table 2 for comparison.

Data in FIGS. 5 and 6, and Table 2 showed a surprising result that the combination of t-BC and 8HQ gave better corrosion inhibition of Al corrosion than either component individually. Furthermore, the Tafel curves for the mixed corrosion inhibitor did not show a limiting corrosion current, indicating perfect passivation within the range of potential evaluated. This showed the synergistic effect of the combination of corrosion inhibitors in 18647-76K.

Al etch rates of formulation 18657-76B containing 1 wt % of catechol, and 1 wt % of 8 hydroxyquinoline (8HQ), and formulation 18647-76K containing 1 wt % of tertiary butyl catechol (tBC) and 1 wt % of 8 hydroxyquinoline (8HQ), were measured and shown in Table 3. The alkanol amine and hydroxylamine concentrations in the formulations were held in the same level.

The results in Table 3 showed that the etch rate at 45° C. for 18647-76B was much higher than for 18647-76K. This indicated that the mixture of catechol and 8HQ was a poor corrosion inhibitor for Al.

TABLE 3

Comparison of effect of catechol and tBC in combination of 8HQ on Al etch rate

| Formulation | 18647-76K | 18647-76B |
|---|---|---|
| Monoethanol amine | 20.0 | 20.0 |
| hydroxyl amine | 7.5 | 7.5 |
| Catechol | 0.0 | 1.0 |
| 8Hydroxyquinoline | 1.0 | 1.0 |
| t-butyl catechol | 1.0 | 0.0 |
| Water | 70.5 | 70.5 |
| Al etch rate (ER), A/min | 1.0 | 70.0 |
| Temperature of ER, C. | 45.0 | 45.0 |

On the contrary, while the mixture of tBC and 8HQ was consistently shown to be an excellent corrosion inhibitor for Al.

Example 5

Hydroxylamine Stability in Water-Rich Formulations Using the Combination of Tertiary Butyl Catechol (tBC) and 8 Hydroxyquinoline (8HQ)

Figure 7:
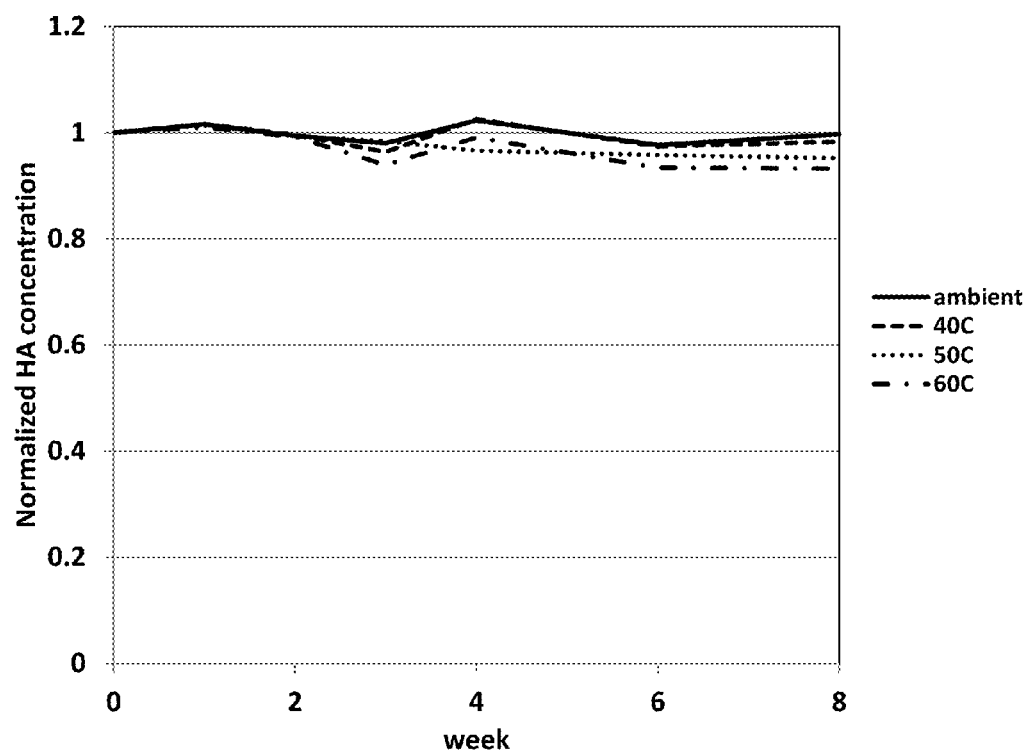
FIG. 7. Stability of hydroxylamine as a function of temperature in a water-rich formulation having tertiary butyl catechol (tBC) and 8 hydroxyquinoline (8HQ).

Hydroxylamine stability (or the decomposition of hydroxylamine) in water-rich formulation 18647-76K having the combination of 1 wt % of tBC and 1 wt % of 8HQ, was measured. The results were shown in FIG. 7.

The results showed that formulation 18647-76K had a very stable hydroxylamine concentration over a wide range of temperatures for over 6 weeks. Thus, the combination of tBC and 8HQ as the corrosion inhibitor in water-rich stripper formulations, did not no degrade hydroxylamine, most importantly did not catalyze the decomposition of hydroxylamine.

Example 6

The galvanic couple current (GCC) is a measure of the oxidation (etch rate) of an electrochemically active metal when electrically connected to another metal when in contact with an electrolyte.

A series of formulations was prepared (see table 4) and tested as electrolytes in galvanic couple current measurements.

In these tests, an Al/0.5 wt % Cu was the active electrode and was connected to TiN and immersed in a cleaning formulation (electrolyte). The current between the two metals was measured using a galvanostat/potentiostat. Higher galvanic couple currents indicates higher corrosion rate.

More specifically, a 400 ml Teflon beaker was filled with 250 ml of a formulation. The sample was heated to 35° C. on a hot plate and magnetic stir bar was used to stir the solution. A 8 cm×2 cm piece of Al/0.5% Cu wafer was immersed to a depth of 4 cm into the formulation. A similar-sized piece of TiN was also immersed into the formulation to the same depth. The wafer samples were separated by a distance 4 cm. Al/0.5% Cu was the working electrode, TiN was the counter and reference electrode. Since Al/0.5% Cu was electrochemically active to TiN, the GCC indicates the corrosion rate of aluminum. A Gamry galvanostat/potentiostat was then connected to the 2 pieces. The GCC was measured over 900 secs.

First three sets of formulations were prepared with different solvents.

Formulations 83A, 83B, and 83C contained propylene glycol. Formulations 83D, 83E and 83F contained dipropylene glycol monomethyl ether. Formulations 83G, 83H and 83I contained tetrahydrofurfural alcohol.

A fourth set of formulations were prepared without solvent: they were 18647-76K, 18647-78F, and 18647-79A.

Within each group, the corrosion inhibitor was varied to be a mixture of 1 wt % tertbutyl catechol (tBC) and 1 wt % of 8 hydroxyquinoline (8HQ), only 1% tBC, or only 1 wt % 8HQ.

The results were shown in Table 4 below.

By comparing the galvanic couple current (GCC) of the first three formulations within the groups, which corrosion inhibitors most effectively reduced the GCC (i.e. suppressed Al corrosion) were evaluated.

TABLE 4

Galvanic couple currents of formulations containing solvent and various corrosion inhibitors.

| Component | Wt % | Wt % | Wt % |
|---|---|---|---|
| | Formulation 83A | Formulation 83B | Formulation 83C |
| Monoethanolamine | 20.00 | 20.00 | 20.00 |
| Hydroxylamine | 7.50 | 7.50 | 7.50 |
| Water | 55.50 | 56.50 | 56.50 |
| Propylene glycol | 15.00 | 15.00 | 15.00 |
| 8-hydoxyquinoline | 1.00 | — | 1.00 |
| Tertiary butyl catechol | 1.00 | 1.00 | — |
| GCC, Amp/cm2 | $2.28 \times 10^{-6}$ | $1.39 \times 10^{-5}$ | $1.24 \times 10^{-4}$ |
| | Formulation 83D | Formulation 83E | Formulation 83F |
| Monoethanolamine | 20.00 | 20.00 | 20.00 |
| Hydroxylamine | 7.50 | 7.50 | 7.50 |
| Water | 55.50 | 56.50 | 56.50 |
| 8-hydoxyquinoline | 1.00 | — | 1.00 |
| Tertiary butyl catechol | 1.00 | 1.00 | — |
| Dipropylene glycol monomethyl ether | 15.00 | 15.00 | 15.00 |
| GCC, Amp/cm2 | $2.54 \times 10^{-6}$ | $3.27 \times 10^{-6}$ | $9.81 \times 10^{-5}$ |
| | Formulation 83G | Formulation 83H | Formulation 83I |
| Monoethanolamine | 20.00 | 20.00 | 20.00 |
| Hydroxylamine | 7.50 | 7.50 | 7.50 |
| Water | 55.50 | 56.50 | 56.50 |
| 8-hydoxyquinoline | 1.00 | — | 1.00 |
| Tertiary butyl catechol | 1.00 | 1.00 | — |
| Tetrahydrofurfural alcohol | 15.00 | 15.00 | 15.00 |
| GCC, Amp/cm2 | $4.55 \times 10^{-6}$ | $5.15 \times 10^{-5}$ | $1.51 \times 10^{-4}$ |
| | 18647-76K | 18647-78F | 18647-79A |
| Monoethanolamine | 20.00 | 20.00 | 20.00 |
| Hydroxylamine | 7.50 | 7.50 | 7.50 |
| Water | 70.50 | 71.50 | 71.50 |
| 8-hydoxyquinoline | 1.00 | — | 1.00 |
| Tertiary butyl catechol | 1.00 | 1.00 | — |
| GCC, Amp/cm2 | $1.08 \times 10^{-6}$ | $2.65 \times 10^{-5}$ | $1.55 \times 10^{-4}$ |

Table 4 indicated that the lowest galvanic couple current was always obtained when the mixture of 1 wt % tBC and 1 wt % 8HQ was used. The formulations containing only 1% tBC or only 1% 8HQ had a higher GCC indicating a higher Al corrosion rate. These data indicated that mixture of the two inhibitors is preferred over either one individually.

A fifth set of formulations were prepared with corrosion inhibitors having methyl dihydroxybenzenes in combination with 8 hydroxyquinoline. Two methyl dihydroxybenzenes: 2 methyl recorsinol (2MR) and methylhydroquinone (MHQ) were used: 4B and 4G with 2MR shown in Table 5, and 4C and 4H with MHQ were shown in Table 6.

TABLE 5

Effect of 2-methylresorcinol (2MR) and 8HQ as corrosion inhibitors

| Component | Formulation 4B Wt % | Formulation 4G Wt % | Formulation 79A Wt % |
|---|---|---|---|
| Monoethanolamine | 20.00 | 20.00 | 20.00 |
| Hydroxylamine | 7.50 | 7.50 | 7.50 |
| Water | 70.75 | 71.75 | 71.50 |
| 8-hydoxyquinoline | 1.00 | 0.00 | 1.00 |
| 2-methylresorcinol | 0.75 | 0.75 | 0.00 |
| GCC, A/cm2 | $1.66 \times 10^{-04}$ | $7.08 \times 10^{-05}$ | $1.55 \times 10^{-04}$ |

The effect of formulations having methyl dihydroxybenzenes in combination with 8 hydroxyquinoloine on GCC were shown in both Table 5 and 6. Formulations 4B, 4G, 4C and 4H were also compared to formulation 18647-79A.

Formulations with methyl dihydroxybenzenes [2 methyl recorsinol (2MR) and methylhydroquinone (MHQ)] showed different GCC behavior compared to tBC in combination with 8HQ, formulations with 2MR and MHQ showed GCC values higher than when they were alone in the formulation. This indicates that the methyl dihydroxybenzenes enhance corrosion in the presence of 8HQ.

TABLE 6

Effect of Methyl hydroquinone (MHQ) and 8HQ as corrosion inhibitors

| Component | Formulation 4C Wt % | Formulation 4H Wt % | Formulation 79A Wt % |
|---|---|---|---|
| Monoethanolamine | 20.00 | 20.00 | 20.00 |
| Hydroxylamine | 7.50 | 7.50 | 7.50 |
| Water | 70.75 | 71.75 | 71.50 |
| 8-hydoxyquinoline | 1.00 | 0.00 | 1.00 |
| methyl hydroquinone | 0.75 | 0.75 | 0.00 |
| GCC, A/cm2 | $2.51 \times 10^{-04}$ | $1.70 \times 10^{-04}$ | $1.55 \times 10^{-04}$ |

A seventh set of formulations were prepared with different water-soluble solvent and no monoethanolamine: formulations 9M, 9N, 9O were prepared using dipropylene glycol monomethyl ether.

TABLE 7

Effect of Solvent

| Component | Formulation 9N Wt % | Formulation 9O Wt % | Formulation 9M Wt % |
|---|---|---|---|
| Dipropylene glycol monomethyl ether | 20.00 | 20.00 | 20.00 |
| Hydroxylamine | 10.00 | 10.00 | 10.00 |
| Water | 69.30 | 69.50 | 69.80 |
| 8-hydoxyquinoline | 0.20 | 0.00 | 0.20 |
| t-Butyl catechol | 0.50 | 0.50 | 0.00 |
| GCC, A/cm2 | $6.06 \times 10^{-08}$ | $6.08 \times 10^{-06}$ | $6.67 \times 10^{-08}$ |

A eighth set of formulations were prepared with different concentration of corrosion inhibitors (see Table 8): formulations 10A, 10B and 9F. The corrosion inhibitors were the combination of tBC and 8HQ.

The impact of the corrosion inhibitor concentration change was shown in Table 8. Formulations 10A, 10B and 9F used tBC and 8HQ at a total of 4%. Again, the combination of the two corrosion inhibitors gives lower GCC than either of them used individually.

It is understood by those in the art that the corrosion inhibitors must be soluble in the solution to be effective. Adding corrosion inhibitors to solutions beyond their solubility limit will not improve corrosion inhibition and will cause other issues in semiconductor wafer cleaning, such as deposition of solid particles onto the wafer surface. The formulations had a upper limitation for the total of the corrosion inhibitors not more than 5%.

TABLE 8

Effect of Corrosion inhibitor concentration

| Component | Formulation 10A Wt % | Formulation 10B Wt % | Formulation 9F Wt % |
|---|---|---|---|
| Monoethanolamine | 20.00 | 20.00 | 20.00 |
| Hydroxylamine | 7.50 | 7.50 | 7.50 |
| Water | 68.50 | 70.50 | 70.50 |
| 8-hydoxyquinoline | 2.00 | 0.00 | 2.00 |
| T-Butyl catechol | 2.00 | 2.00 | 0.00 |
| GCC, A/cm2 | $1.03E \times 10^{-07}$ | $1.56 \times 10^{-07}$ | $2.58 \times 10^{-04}$ |

The results from Examples 1 to 3 have shown that catechol was not an effective corrosion inhibitor and was not effective at stabilizing the hydroxylamine. In fact, the use of catechol was effective catalyzing the decomposition or degradation of hydroxylamine contained in the water-rich formulations.

The results from Example 4 and 5 have shown that combinations of tBC and 8HQ were excellent corrosion inhibitors for aluminum and excellent stabilizers for hydroxylamine contained in the water-rich formulations. The results were compared with when catechol used alone, either of the components: tBC or 8HQ used alone individually, and the mixtures of catechol with either of the components.

The results from Example 6 had several teachings.

The lowest galvanic couple current was obtained when the mixtures of tBC and 8HQ was used comparing with either of them used individually. This result was the same when the formulations containing monoethanolamine without water-soluble solvents, water-soluble solvents without monoethanolamine, or the combination of monoethanolamine and different water-soluble solvents. Again, the results have indicated that combinations of tBC and 8HQ were excellent corrosion inhibitors for aluminum.

Furthermore, the methyl dihydroxybenzenes have been found to enhance corrosion in the presence of 8HQ.

Finally, it was found the total corrosion inhibitors in the formulation has an upper limit.

In conclusion, a water-rich formulation containing hydroxylamine having the mixed components of alkyl dihydroxybenzenes (such as tertiary butyl catechol or t-BC) and a hydroxyquinoline (such as 8 hydroxyquinoline or 8HQ) has: (1) lower Al corrosion rate (as determined from electrochemical measurements), and (2) excellent stability of hydroxylamine in the formulation.

The foregoing examples and description of the preferred embodiments should be taken as illustrating, rather than as limiting the present invention as defined by the claims. As will be readily appreciated, numerous variations and combinations of the features set forth above can be utilized without departing from the present invention as set forth in the claims. Such variations are not regarded as a departure from the spirit and scope of the invention, and all such variations are intended to be included within the scope of the following claims.

The invention claimed is:

1. A water-rich stripping and cleaning formulation, consisting essentially of:
    from 1 to 30% by weight of at least one selected from a hydroxylamine, a hydroxylamine salt compound, and mixtures thereof;
    from 0.1 to 5% by weight of a corrosion inhibitor containing a mixture of alkyl dihydroxybenzene and hydroxyquinoline;
    one component selected from the group consisting of from 5% to 45% by weight of an alkanolamine which is miscible with said hydroxylamine, from 5% to 45% by weight of a water-soluble solvent, and combinations thereof; and
    at least 50% by weight of water.

2. The formulation as claimed in claim 1, wherein the alkyl dihydroxybenzene has linear or branched alkyl group containing 2-6 carbon atoms, and the hydroxyquinoline is selected from group consisting of 2-hydroxyquinoline, 4-hydroxyquinoline, 6-hydroxyquinoline, and 8-hydroxyquinoline.

3. The formulation as claimed in claim 1, wherein the alkyl dihydroxybenzene is tertiary butyl catechol, and the hydroxyquinoline is 8 hydroxyquinoline.

4. The formulation as claimed in claim 1, wherein the one component is the alkanolamine selected from the group consisting of monoethanolamine, aminoethoxyethanol, aminopropylmorpholine, monoethanolamine, N-methyl ethanolamine, N-ethyl ethanolamine, N,N-dimethylethanolamine, N,N-diethyl ethanolamine, N-methyl diethanolamine, N-ethyl diethanolamine, diethanolamine, triethanol amine, tertiarybutyldiethanol amine, isopropanolamine, 2-amino-1-propanol, 3-amino-1-propanol, 2-amino-1-butanol, isobutanolamine, 2-amino-2-ethoxypropanol, 2-amino-2-ethoxyethanol, and mixtures thereof.

5. The formulation as claimed in claim 4, wherein the alkyl dihydroxybenzene is tertiary butyl catechol, the hydroxyquinoline is 8-hydroxyquinoline, and the alkanolamine is monoethanolamine.

6. The formulation as claimed in claim 1, wherein the one component is the water-soluble solvent selected from the group consisting of ethylene glycol, propylene glycol, benzyl alcohol, dimethyl sulfoxide, dimethylurea, glycerol, dipropylene glycol monomethyl ether, n-methyl pyrrolidone, tetrahydrofurfural alcohol, tetramethoxyethane, and mixtures thereof.

7. The formulation as claimed in claim 6, wherein the alkyl dihydroxybenzene is tertiary butyl catechol, the hydroxyquinoline is 8-hydroxyquinoline, and the water-soluble solvent is selected from the group consisting of ethylene glycol, propylene glycol, benzyl alcohol, dimethyl sulfoxide, dimethylurea, glycerol, dipropylene glycol monomethyl ether, n-methyl pyrrolidone, tetrahydrofurfural alcohol, tetramethoxyethane, and mixtures thereof.

8. The formulation as claimed in claim 1, wherein the one component is the combination of the alkanolamine miscible with said hydroxylamine and the water-soluble solvent.

9. The formulation as claimed in claim 8, wherein the alkanolamine is monoethanolamine, and the water-soluble solvent is selected from the group consisting of ethylene glycol, propylene glycol, benzyl alcohol, dimethyl sulfoxide, dimethylurea, glycerol, dipropylene glycol monomethyl ether, n-methyl pyrrolidone, tetrahydrofurfural alcohol, tetramethoxyethane, and mixtures thereof.

10. The formulation as claimed in claim 1, wherein the alkyl dihydroxybenzene is tertiary butyl catechol, the hydroxyquinoline is 8-hydroxyquinoline, the alkanolamine is monoethanolamine, and the water-soluble solvent is selected from the group consisting of ethylene glycol, propylene glycol, benzyl alcohol, dimethyl sulfoxide, dimethylurea, glycerol, dipropylene glycol monomethyl ether, n-methyl pyrrolidone, tetrahydrofurfural alcohol, tetramethoxyethane, and mixtures thereof.

11. A method of removing photoresist, etch or ash residue, and contaminants from a semiconductor substrate, comprising:
contacting the semiconductor substrate with a formulation comprising:
from 1 to 30% by weight of at least one selected from a hydroxylamine, a hydroxylamine salt compound, and mixtures thereof;
from 0.1 to 5% by weight of a corrosion inhibitor containing a mixture of alkyl dihydroxybenzene and hydroxyquinoline;
one component selected from the group consisting of from 5% to 45% by weight of an alkanolamine which is miscible with said hydroxylamine,
from 5% to 45% by weight of a water-soluble solvent, and the combinations thereof; and
at least 50% by weight of water.

12. The method as claimed in claim 11, wherein the alkyl dihydroxybenzene has linear or branched alkyl group contains 2-6 carbon atoms, and the hydroxyquinoline is selected from group consisting of 2-hydroxyquinoline, 4-hydroxyquinoline, 6-hydroxyquinoline, and 8 hydroxyquinoline.

13. The method as claimed in claim 11, wherein the alkyl dihydroxybenzene is tertiary butyl catechol, and the hydroxyquinoline is 8 hydroxyquinoline.

14. The method as claimed in claim 11, wherein the one component is the alkanolamine selected from the group consisting of monoethanolamine, aminoethoxyethanol, aminopropylmorpholine, monoethanolamine, N-methyl ethanolamine, N-ethyl ethanolamine, N,N-dimethylethanolamine, N,N-diethyl ethanolamine, N-methyl diethanolamine, N-ethyl diethanolamine, diethanolamine, triethanol amine, tertiarybutyldiethanol amine, isopropanolamine, 2-amino-1-propanol, 3-amino-1-propanol, 2-amino-1-butanol, isobutanolamine, 2-amino-2-ethoxypropanol, 2-amino-2-ethoxyethanol, and mixtures thereof.

15. The method as claimed in claim 14, wherein the alkyl dihydroxybenzene is tertiary butyl catechol, the hydroxyquinoline is 8-hydroxyquinoline, and the alkanolamine is monoethanolamine.

16. The method as claimed in claim 11, wherein the one component is the water-soluble solvent selected from the group consisting of ethylene glycol, propylene glycol, benzyl alcohol, dimethyl sulfoxide, dimethylurea, glycerol, dipropylene glycol monomethyl ether, n-methyl pyrrolidone, tetrahydrofurfural alcohol, tetramethoxyethane, and mixtures thereof.

17. The method as claimed in claim 16, wherein the alkyl dihydroxybenzene is tertiary butyl catechol, the hydroxyquinoline is 8-hydroxyquinoline, and the water-soluble solvent is selected from the group consisting of ethylene glycol, propylene glycol, benzyl alcohol, dimethyl sulfoxide, dimethylurea, glycerol, dipropylene glycol monomethyl ether, n-methyl pyrrolidone, tetrahydrofurfural alcohol, tetramethoxyethane, and mixtures thereof.

18. The method as claimed in claim 11, wherein the one component is the combination of the alkanolamine miscible with said hydroxylamine and the water-soluble solvent.

19. The method as claimed in claim 18, wherein the alkanolamine is monoethanolamine, and the water-soluble solvent is selected from the group consisting of ethylene glycol, propylene glycol, benzyl alcohol, dimethyl sulfoxide, dimethylurea, glycerol, dipropylene glycol monomethyl ether, n-methyl pyrrolidone, tetrahydrofurfural alcohol, tetramethoxyethane, and mixtures thereof.

20. The method as claimed in claim 11, wherein the alkyl dihydroxybenzene is tertiary butyl catechol, the hydroxyquinoline is 8-hydroxyquinoline, the alkanolamine is monoethanolamine, and the water-soluble solvent is selected from the group consisting of ethylene glycol, propylene glycol, benzyl alcohol, dimethyl sulfoxide, dimethylurea, glycerol, dipropylene glycol monomethyl ether, n-methyl pyrrolidone, tetrahydrofurfural alcohol, tetramethoxyethane, and mixtures thereof.

* * * * *